(12) United States Patent
Tanaka et al.

(10) Patent No.: US 7,804,088 B2
(45) Date of Patent: Sep. 28, 2010

(54) SEMICONDUCTOR DEVICE, MANUFACTURING METHOD OF SEMICONDUCTOR DEVICE, DISPLAY DEVICE, AND MANUFACTURING METHOD OF DISPLAY DEVICE

(75) Inventors: Atsushi Tanaka, Ashigarakami-gun (JP); Ken-ichi Umeda, Ashigarakami-gun (JP); Kohei Higashi, Ashigarakami-gun (JP); Maki Nangu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/418,991

(22) Filed: Apr. 6, 2009

(65) Prior Publication Data

US 2009/0250695 A1 Oct. 8, 2009

(30) Foreign Application Priority Data

Apr. 4, 2008 (JP) .............................. 2008-098347

(51) Int. Cl.
*H01L 33/00* (2010.01)

(52) U.S. Cl. .......... 257/43; 257/E21.459; 257/E29.296; 438/104

(58) Field of Classification Search .................. 257/43, 257/E21.459, E29.296; 438/104
See application file for complete search history.

(56) References Cited

U.S. PATENT DOCUMENTS

| 2006/0108636 | A1 | 5/2006 | Sano et al. | |
| 2006/0110867 | A1* | 5/2006 | Yabuta et al. | ............... 438/151 |
| 2007/0057261 | A1 | 3/2007 | Jeong et al. | |
| 2007/0194379 | A1* | 8/2007 | Hosono et al. | ............. 257/347 |
| 2007/0215945 | A1* | 9/2007 | Tokunaga et al. | ........... 257/347 |
| 2009/0026452 | A1* | 1/2009 | Miyaguchi et al. | ............ 257/59 |

FOREIGN PATENT DOCUMENTS

| JP | 2003-298062 A | 10/2003 |
| JP | 2006-165529 A | 6/2006 |
| JP | 2007-81362 A | 3/2007 |

* cited by examiner

*Primary Examiner*—Trung Dang
(74) *Attorney, Agent, or Firm*—Sughrue Mion, PLLC

(57) ABSTRACT

A semiconductor device includes a substrate and a semiconductor layer having a channel region, the channel region is made from an oxide semiconductor which satisfies Vc/Va>4 where Vc is a volume ratio of a crystalline component and Va is a volume ratio of a non-crystalline component.

29 Claims, 3 Drawing Sheets

FORMATION OF GATE ELECTRODE

FORMATION OF GATE INSULATING FILM

FORMATION OF SEMICONDUCTOR LAYER

FORMATION OF SOURCE/DRAIN ELECTRODE PATTERNS

FORMATION OF INTERLAYER INSULATING FILM

FORMATION OF PIXEL ELECTRODE

US 7,804,088 B2

SEMICONDUCTOR DEVICE, MANUFACTURING METHOD OF SEMICONDUCTOR DEVICE, DISPLAY DEVICE, AND MANUFACTURING METHOD OF DISPLAY DEVICE

CROSS-REFERENCE TO RELATED APPLICATIONS

This application claims the benefit of Japanese Patent Application JP 2008-098347, filed Apr. 4, 2008, the entire content of which is hereby incorporated by reference, the same as if set forth at length.

FIELD OF THE INVENTION

The present invention relates to a semiconductor device, a manufacturing method of a semiconductor device, and a display device. More particularly, the invention relates to a semiconductor device which is suitably used as a TFT (thin-film transistor) that is used as a switching element of each of pixels provided in an active-matrix-driven display panel.

BACKGROUND OF THE INVENTION

TFTs are used as switching elements of respective pixels in active-matrix-driven display panels as typified by LCDs. Although amorphous silicon is used most commonly as a semiconductor layer, its mobility is as low as about 0.5 cm$^2$/V·s. In view of this, in recent years, for use in large-size, high-resolution LCDs and organic light-emitting diodes (OLEDs; hereinafter also referred to as organic EL diodes) which enables high-quality display, oxide semiconductor TFTs using, for example, IGZO (In—Ga—Zn—O) whose mobility is higher than or equal to 10 cm$^2$/V·s have been being developed. Materials as typified by IGZO are thought to provide such advantages as increase in aperture ratio and increase in the resolution of a display by virtue of their features that in general they have as wide band gaps as 3 eV and are transparent (i.e., have no absorptions in the visible range) (refer to JP-A-2007-81362 (corresponding to US2007/0057261A1), for example).

JP-A-2006-165529 (corresponding to US2006/0108636A1) discloses the configuration of a transistor which employs, as the material of an active layer, a microcrystal-containing amorphous oxide whose carrier density is lower than 10$^{18}$ cm$^{-3}$ and which contains at least one of In, Zn, and Ga.

JP-A-2003-298062 discloses the configuration of a thin-film transistor which uses, as an active layer, an oxide semiconductor film having ZnO as the main component.

JP-A-2007-81362 (corresponding to US2007/0057261A1) discloses the configuration of a thin-film transistor which uses a transparent semiconductor layer made of an oxide, nitride, or carbide substance.

SUMMARY OF THE INVENTION

However, in actuality, even conventional oxide semiconductors are not entirely free of absorptions in the visible range and are associated with a problem that, for example, an erroneous operation such as an off-current increase is caused by carrier excitation due to slight light absorption. In particular, IGZO, which exhibits high mobility and stable characteristics, is generally used in the form of an amorphous film and hence has relatively large absorptions. Its characteristics are influenced by a light source such as a backlight or an organic EL device so seriously as to be unsuitable for practical use.

The present invention has been made in the above circumstances, and an object of the invention is therefore to provide a semiconductor device which can suppress generation of dark current and is suitably used as a current driving element of an organic EL device or the like as well as a manufacturing method of such a semiconductor device and a display device incorporating such a semiconductor device.

The above object of the invention is attained by the following configurations and procedures:

(1) A semiconductor device comprising a substrate and a semiconductor layer having a channel region, wherein:

the channel region is made of an oxide semiconductor which satisfies Vc/Va>4 where Vc is a volume ratio of a crystalline component and Va is a volume ratio of a non-crystalline component.

(2) The semiconductor device according to item (1), wherein the oxide semiconductor contains In and Zn.

(3) The semiconductor device according to item (2), wherein the oxide semiconductor further contains at least one of Ga and Al.

(4) The semiconductor device according to any one of items (1) to (3), wherein thickness of the semiconductor layer is smaller than 300 nm.

(5) The semiconductor device according to any one of items (1) to (4), wherein mobility μ of the semiconductor layer is higher than or equal to 0.5 cm$^2$/V·s.

(6) The semiconductor device according to any one of items (1) to (5), wherein mobility μ of the semiconductor layer is higher than or equal to 10 cm$^2$/V·s.

(7) A display device comprising the semiconductor device according to any one of items (1) to (6).

(8) The display device according to item (7), wherein the display device is a light-transmission-type display or a bottom-emission-type light emission display.

(9) The display device according to item (7) or (8), further comprising a transparent gate electrode, wherein at least part of incident light passes through the channel region and the gate electrode.

(10) The display device according to any one of items (7) to (9), wherein at least 50% of incident light passes through the channel region.

(11) The display device according to any one of items (7) to (10), wherein the display device comprises plural semiconductor devices and at least part of the plural semiconductor devices function as switching elements.

(12) The display device according to item (11), wherein the switching devices perform driving in such a manner that a ratio of on-current to off-current is larger than or equal to 10$^6$.

(13) The display device according to any one of items (7) to (10), wherein the display device comprises plural semiconductor devices and at least part of the plural semiconductor devices function as current driving elements for light-emitting elements.

(14) The display device according to any one of items (7) to (13), further comprising a light absorption layer disposed on the light incidence side of the channel region, for absorbing at least part of light having a wavelength range of 400 nm or less of incident light.

(15) The display device according to any one of items (7) to (13), further comprising a light absorption layer disposed on the light incidence side of the channel region, for absorbing at least part of light having a wavelength range of 350 nm or less of incident light.

(16) The display device according to item (14) or (15), wherein the light absorption layer also serves as at least one of the substrate and a polarizing plate.

(17) A manufacturing method of a semiconductor device comprising a substrate and a semiconductor layer having a channel region, wherein:

the channel region is formed with an oxide semiconductor which satisfies Vc/Va>4 where Vc is a volume ratio of a crystalline component and Va is a volume ratio of a non-crystalline component.

(18) The manufacturing method of a semiconductor device according to item (17), wherein the oxide semiconductor contains In and Zn.

(19) The manufacturing method of a semiconductor device according to item (18), wherein the oxide semiconductor further contains at least one of Ga and Al.

(20) The manufacturing method of a semiconductor device according to any one of items (17) to (19), wherein thickness of the semiconductor layer is smaller than 300 nm.

(21) The manufacturing method of a semiconductor device according to any one of items (17) to (20), wherein the semiconductor device is formed by forming a film using a precursor solution or a fine particle dispersion liquid for the semiconductor layer and annealing the film by heat or light.

(22) The manufacturing method of a semiconductor device according to any one of items (17) to (21), wherein the semiconductor device is formed by forming a film that satisfies Vc/Va<0.25 and annealing the film by heat or light.

(23) The manufacturing method of a semiconductor device according to any one of items (17) to (22), wherein mobility μ of the semiconductor layer is higher than or equal to 0.5 $cm^2/V \cdot s$.

(24) The manufacturing method of a semiconductor device according to any one of items (17) to (23), wherein mobility μ of the semiconductor layer is higher than or equal to 10 $cm^2/V \cdot s$.

(25) A manufacturing method of a display device comprising the semiconductor device manufactured by the manufacturing method according to any one of items (17) to (24), wherein:

a transparent gate electrode is formed and part of incident light passes through the channel region and the gate electrode.

(26) The manufacturing method of a display device according to item (25), wherein at least 50% of the incident light passes through the channel region.

(27) The manufacturing method of a display device according to item (25) or (26), wherein a light absorption layer for absorbing at least part of light having a wavelength range of 400 nm or less of the incident light is formed on the light incidence side of the channel region.

(28) The manufacturing method of a display device according to any one of items (25) to (27), a light absorption layer for absorbing at least part of the light having a wavelength range of 350 nm or less of the incident light is formed on the light incidence side of the channel region

(29) The manufacturing method of a display device according to item (27) or (28), wherein the light absorption layer also serves as at least one of the substrate and a polarizing plate.

In semiconductor device according to the invention, the channel region of the semiconductor layer employs a polycrystalline film which is composed of the crystalline component and the non-crystalline component. Since the ratio of the crystalline component to the non-crystalline component is larger than or equal to 4, the degree of absorption of visible light is much lower than in ordinary amorphous IGZO films and no characteristic abnormality such as off-current increase occurs even under illumination with light. Therefore, the semiconductor device operates stably even if it has a configuration that the gate electrode, the pixel electrode, etc. are made of transparent materials and the channel region is caused to transmit light. As such, even when applied to a high-resolution transmission-type display or a bottom-emission-type light-emission display, the semiconductor device can provide a display in which a large aperture ratio is secured and high-quality display can be performed at a lower power consumption. Being a polycrystal, the semiconductor layer is advantageous over an amorphous film in terms of stability when the semiconductor device is used as a current driving element of an organic EL device.

The invention can provide a semiconductor device which can suppress generation of dark current and is suitably used as a current driving element of an organic EL device or the like as well as a manufacturing method of such a semiconductor device and a display device incorporating such a semiconductor device.

DETAILED DESCRIPTION OF THE INVENTION

An embodiment of the present invention will be hereinafter described in detail with reference to the drawings.

Figure 1:
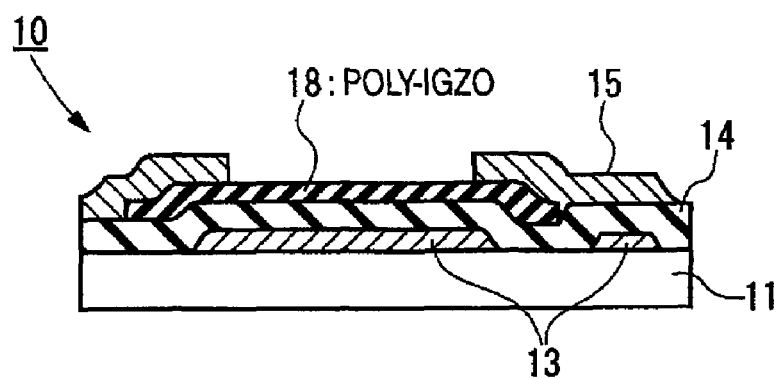
FIG. 1 is a sectional view showing the configuration of a semiconductor device according to the present invention.

FIG. 1 is a sectional view showing an example basic configuration of a semiconductor device according to the invention.

The semiconductor device 10 according to the embodiment serves as a semiconductor element having a TFT structure that is formed in each of plural pixel forming regions that are arranged in matrix form on a substrate such as a transparent glass substrate.

As shown in FIG. 1, the semiconductor device 10 is provided with a transparent substrate 11 and a gate electrode 13 is formed on the top surface of the substrate 11.

The substrate 11 may be a glass substrate, a quartz substrate, or a film made of PET, PEN, PES, or the like.

A transparent gate insulating film 14 made of $SiO_2$, $SiN_x$, $Al_2O_3$, $Y_2O_3$, or the like is formed on the substrate 11 so as to cover the gate electrode 13. A semiconductor layer 18 having an island-shaped pattern is formed on the gate insulating film 14. The semiconductor layer 18 is formed at a thickness of 50 nm, for example. It is preferable that the thickness of the semiconductor layer 18 be smaller than 300 nm.

As for the forming method of the semiconductor layer 18, patterning may be performed by photolithography after vacuum film formation. Alternatively, it may be formed by a printing technology using a liquid material such as alkoxide.

Electrode layers 15 which function as a source electrode and a drain electrode are formed on the semiconductor layer 18 in prescribed patterns. The electrode layers 15 may be made of aluminum, an aluminum alloy, or the like.

A layer for cutting ultraviolet light (λ<350 nm) may be formed on the substrate 11. Where the substrate 11 is a resin film, a gas barrier layer or a heat barrier layer may be formed on the substrate 11.

In the semiconductor device 10 according to the embodiment, a channel region is formed in the semiconductor layer 18. The semiconductor device 10 is configured in such a manner that at least part of incident light passes through the channel region and the gate electrode 13. In a transmission-type LCD, for example, at least part of incident light passes through the channel region and the gate electrode 13 in this order in the case where the semiconductor device 10 has a top-gate structure. At least part of incident light passes through the gate electrode 13 and the channel region in this order in the case where the semiconductor device 10 has a bottom gate structure. It is preferable that the semiconductor device 10 be configured so that at least 50% of incident light passes through the channel region.

The channel region is made of an oxide semiconductor that satisfies a relationship Vc/Va>4 where Vc is the volume ratio of the crystalline component and Va is the volume ratio of the non-crystalline component. The polycrystalline structure of the channel region can be evaluated by means of a TEM (transmission electron microscope), a spectroscopic ellipsometer, etc. In the embodiment, the crystalline component accounts for 90% or more and the non-crystalline component accounts for 10% or less.

The oxide semiconductor may be IGZO. Alternatively, the oxide semiconductor may be a material which contains at least In and Zn. As a further alternative, the oxide semiconductor may be a material which contains In and Zn and at least one of Ga and Al.

It is preferable that the mobility $\mu$ of the semiconductor layer 18 be 0.5 $cm^2/V \cdot s$ or more, and it is even preferable that the mobility $\mu$ of the semiconductor layer 18 be 10 $cm^2/V \cdot s$ or more.

In the semiconductor device 10, a light absorption layer for absorbing at least part of light having a wavelength range of 400 nm or less of incident light may be provided on the light incidence side of the channel region of the semiconductor layer 18. The light absorption layer may be such as to absorb at least part of light having a wavelength range of 350 nm or less. The light absorption layer may also serve as at least one of the substrate 11 and a polarizing plate.

Figure 2:
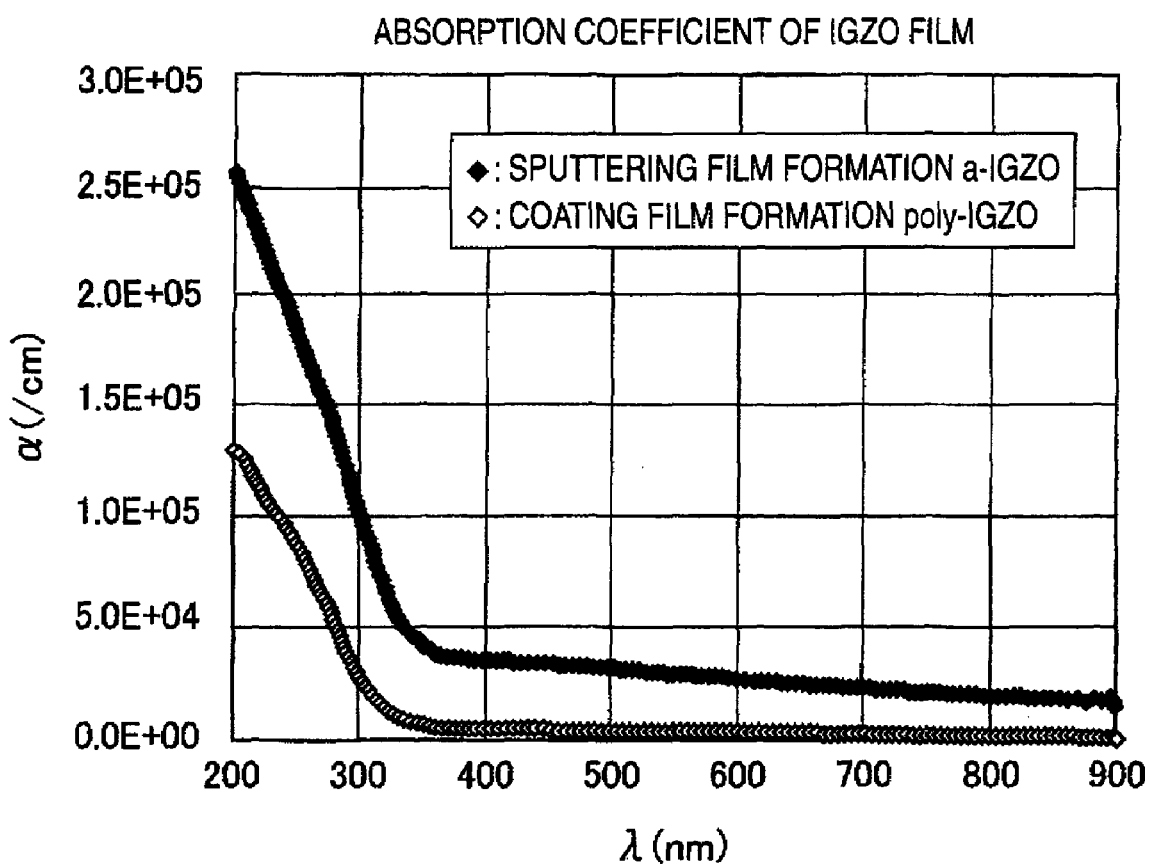
FIG. 2 is a graph showing relationships between the light absorption coefficient and the wavelength of incident light.

FIG. 2 is a graph showing relationships between the light absorption coefficient and the wavelength of incident light. FIG. 2 compares absorption coefficient vs. wavelength curves of a semiconductor layer formed by coating IGZO (poly-IGZO) in which the crystalline component ratio of the poly-crystalline material is larger than 90% as in the embodiment and a semiconductor layer formed by sputtering amorphous IGZO (a-IGZO) in which the crystalline component ratio is less than 10%. As seen from FIG. 2, the absorption coefficient of poly-IGZO is smaller than that of a-IGZO in the entire wavelength range. In particular, the absorption coefficient of poly-IGZO is far smaller than that of a-IGZO in a wavelength range of 350 nm or less.

In the semiconductor device 10 according to the embodiment, the channel region of the semiconductor layer 18 employs a polycrystalline film which is composed of the crystalline component and the non-crystalline component. Since the ratio of the crystalline component to the non-crystalline component is larger than or equal to 4, the degree of absorption of visible light is much lower than in ordinary amorphous IGZO films and no characteristic abnormality such as off-current increase occurs even under illumination with light. Therefore, the semiconductor device 10 operates stably even if it has a configuration that the gate electrode 13, the pixel electrode, etc. are made of transparent materials and the channel region is caused to transmit light. As such, even when applied to a high-resolution transmission-type display or a bottom-emission-type light-emission display, the semiconductor device 10 can provide a display in which a large aperture ratio is secured and high-quality display can be performed at a lower power consumption. Being a polycrystal, the semiconductor layer 18 is advantageous over an amorphous film in terms of stability when the semiconductor device 10 is used as a current driving element of an organic EL device.

Where plural semiconductor devices 10 according to the embodiment are used in a display device, at least part of them may function as switching elements. In this case, it is preferable that the ratio of on-current to off-current of each switching element be larger than or equal to $10^6$. Part of them may function as current driving elements for light-emitting elements.

Next, a description will be made of an example that the semiconductor device 10 according to the embodiment is applied to a transmission-type display. The application range of the semiconductor device according to the invention is not limited to the display device having the following configuration and encompasses other bottom-emission-type light-emission displays etc.

Figure 3:
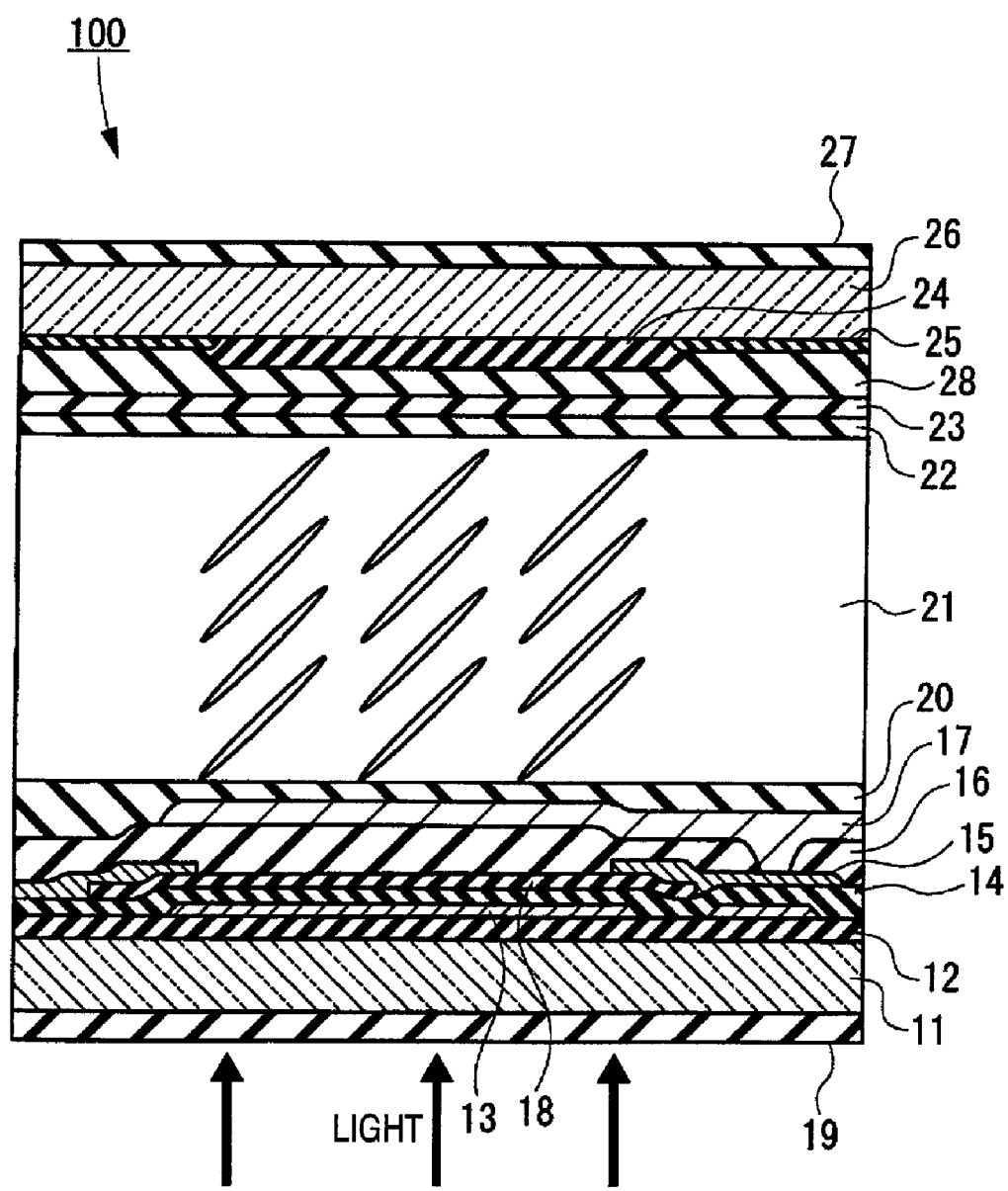
FIG. 3 is a sectional view showing the configuration of a display device.

FIG. 3 is a sectional view showing the configuration of a display device. It is assumed that light coming from a light source enters the display device 100 of FIG. 3 from below. In the following description which will be made with reference to FIG. 3, the terms "top" and "bottom" have meanings as viewed in FIG. 3. The "top surface" means the surface opposite to the light-incidence-side surface and the "bottom surface" means the light-incidence-side surface.

A transparent insulating layer 12 is formed on a light-incidence-side, transparent glass substrate 11 and a gate electrode 13 is formed in a prescribed pattern in each pixel forming region. A gate insulating film 14 is formed so as to cover the gate electrode 13. A semiconductor layer 18 made of an inorganic oxide is formed in a prescribed pattern on the top surface of the gate insulating film 14 in a region that is located over the underlying gate electrode 13.

Electrode layers 15 including a source electrode and a drain electrode are formed so as to be laid on parts of the semiconductor layer 18. An interlayer insulating film 16 is formed on the top surfaces of the electrode layers 15 and a pixel electrode 17 is formed on the interlayer insulating film 16. The pixel electrode 17 is formed in such a manner that at least part of it is in contact with and hence is electrically continuous with the drain electrode 15*b*.

A bottom alignment film 20, a top alignment film 22, and a liquid crystal layer 21 are formed on the pixel electrode 17. The liquid crystal layer 21 is disposed between the pair of alignment films 20 and 22. A transparent counter electrode 23 is formed on the top surface of the top alignment film 22 so as to be opposed to the pixel electrode 17 in the top-bottom direction. A planarization film 28 is formed on the counter electrode 23, and a color filter 24 and an opaque black matrix 25 are arranged on the top surface of the planarization film 28. A transparent glass substrate 26 is disposed on the color filter 24. A polarizing plate 27 is disposed on the top surface of the glass substrate 26.

In the embodiment, a polarizing plate 19 is disposed on the bottom surface of the light-incidence-side glass substrate 11. At least one of the substrate 11 and the polarizing plate 19 may also serve as a light absorption layer for absorbing at least part of light having a wavelength range is 400 nm or less.

The semiconductor layer 18 may be patterned by photolithography or formed by printing using an ink-jet technology. The use of printing enables cost reduction. Since the semiconductor layer 18 is transparent in the visible range, the channel region can be caused to transmit light by also forming the gate electrode 13 and the pixel electrode 17 with a transparent electrode material. This enables a configuration in which the device forming region occupies most of the pixel forming region, and in turn enables application to transmission-type displays and bottom-emission-type light emission displays.

In the semiconductor device and the display device having the above configurations, the absorption coefficient of the semiconductor layer 18 is small (substantially negligible) and hence no leak current flows during illumination with light even without a light shield film. A larger aperture ratio can thus be secured.

Next, a manufacturing procedure of the semiconductor device according to the embodiment will be described with reference to the drawings. In the following description, members etc. that are substantially the same in structure and workings as already described members etc. will be given the same reference numerals as the latter in the drawings and their descriptions will be simplified or omitted.

FIGS. 4A-4F are sectional views showing the manufacturing procedure of the semiconductor device.

Figure 4A:
FIGS. 4A-4F are sectional views showing a manufacturing procedure of the semiconductor device.

First, as shown in FIG. 4A, a transparent gate electrode 13 of ITO, IZO, GZO, or the like is formed on a substrate 11 (e.g., a glass substrate or a film substrate made of PET, PEN, PES, or the like) by photolithography or a printing technology such as ink-jet printing or screen printing.

Figure 4B:
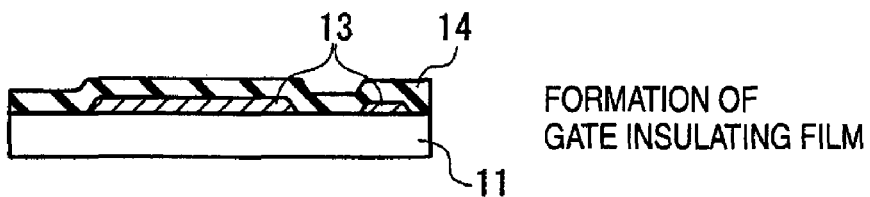

Then, as shown in FIG. 4B, a transparent gate insulating film 14 is formed on the top surface of the substrate 11 so as to cover the gate electrode 13. More specifically, a transparent gate insulating film 14 of $SiO_2$, $SiN_x$, $Al_2O_3$, $Y_2O_3$, or the like is formed by a printing technology such as ink-jet printing or screen printing. As shown in FIG. 3, an insulating layer 12 of $SiN_x$, $SiON_x$, or the like may be formed on the substrate 11 as a gas barrier layer, a heat barrier layer, or an ultraviolet cutting layer.

Figure 4C:
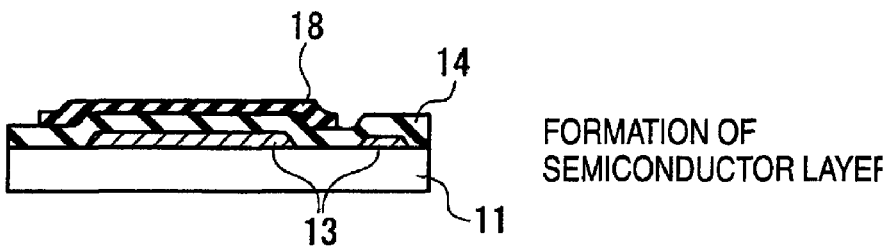

As shown in FIG. 4C, a semiconductor layer 18 which is a thin film of a transparent oxide such as IGZO ($InGaZnO_4$) or ZnO is formed. The semiconductor layer 18 may be formed by performing photolithography after vacuum film formation or formed by a printing technology such as ink-jet printing or screen printing using a liquid material such as alkoxide. As a further alternative, the semiconductor layer 18 may be formed by forming a film using a precursor solution or a fine particle dispersion liquid for the semiconductor layer 18 and annealing the film by heat or light. That is, the semiconductor layer 18 need not be a crystalline film when film formation has been performed. However, where it is not a crystalline film, crystallization is performed by thermal annealing (at 400° C. to 900° C.), laser annealing (with a KrF excimer laser, for example), or the like.

Figure 4D:
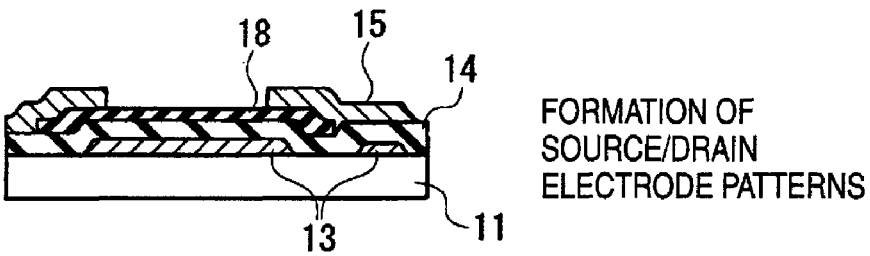

As shown in FIG. 4D, electrode layers 15 (source electrode and drain electrode) are formed with a metal paste or the like. The source electrode and the drain electrode may be formed with Al, an Al alloy, Ti, Ag, Au, or the like. Where the source electrode and the drain electrode should also transmit light, they may be formed as transparent electrodes of ITO, IZO, or the like.

Figure 4E:
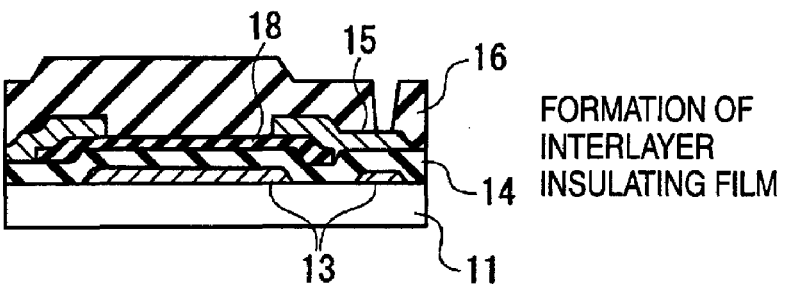
Figure 4F:
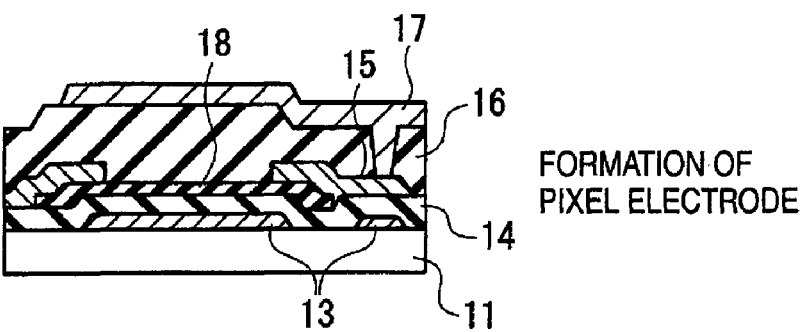

After an interlayer insulating film 16 is formed as shown in FIG. 4E, a pixel electrode 17 is formed on the interlayer insulating film 16 in such a manner that at least part of it is connected to the drain electrode (see FIG. 4F).

In the invention, the gate electrode, the semiconductor layer, and the pixel electrode are transparent to visible light and light coming from a backlight is output through those layers. This configuration can be applied to such displays as bottom-emission-type organic EL displays in addition to transmission-type LCDs.

In the semiconductor layer, absorptions in the visible range are suppressed and hence almost no leak current is caused by illumination with light. However, where the wavelength of a light source extends to an ultraviolet range and the light includes a component whose energy is higher than the band gap of the semiconductor layer, such a component may be shut off by the substrate, polarizing film, ultraviolet cutting layer, gate electrode, or some other member.

The invention is not limited to the above embodiment and can be modified or improved properly.

For example, although the semiconductor device according to the embodiment has what is called a bottom-gate configuration in which the gate electrode is disposed on the substrate side, the invention can also be applied to what is called a top-gate-type configuration in which the gate electrode is disposed on the side opposite to the substrate.

The application range of the semiconductor device according to the invention is not limited to display devices and encompasses semiconductor sensors.

What is claimed is:

1. A semiconductor device comprising a substrate and a semiconductor layer having a channel region, wherein:
   the channel region comprises an oxide semiconductor which satisfies Vc/Va>4 where Vc is a volume ratio of a crystalline component and Va is a volume ratio of a non-crystalline component.

2. The semiconductor device according to claim 1, wherein the oxide semiconductor comprises In and Zn.

3. The semiconductor device according to claim 2, wherein the oxide semiconductor further comprises at least one of Ga and Al.

4. The semiconductor device according to claim 1, wherein the semiconductor layer has a thickness of smaller than 300 nm.

5. The semiconductor device according to claim 1, wherein mobility of the semiconductor layer is higher than or equal to 0.5 $cm^2/V \cdot s$.

6. The semiconductor device according to claim 1, wherein mobility of the semiconductor layer is higher than or equal to 10 $cm^2/V \cdot s$.

7. A display device comprising the semiconductor device according to claim 1.

8. The display device according to claim 7, wherein the display device is a light-transmission-type display or a bottom-emission-type light emission display.

9. The display device according to claim 7, further comprising a transparent gate electrode, wherein at least part of incident light passes through the channel region and the gate electrode.

10. The display device according to claim 7, wherein at least 50% of incident light passes through the channel region.

11. The display device according to claim 7, wherein the display device comprises plural semiconductor devices and at least part of the plural semiconductor devices function as switching elements.

12. The display device according to claim 11, wherein the switching devices perform driving in such a manner that a ratio of on-current to off-current is larger than or equal to $10^6$.

13. The display device according to claim 7, wherein the display device comprises plural semiconductor devices and at least part of the plural semiconductor devices function as current driving elements for light-emitting elements.

14. The display device according to claim 7, further comprising a light absorption layer disposed on the light incidence side of the channel region, for absorbing at least part of light having a wavelength range of 400 nm or less of incident light.

15. The display device according to claim 7, further comprising a light absorption layer disposed on the light incidence side of the channel region, for absorbing at least part of light having a wavelength range of 350 nm or less of incident light.

16. The display device according to claim 14, wherein the light absorption layer also serves as at least one of the substrate and a polarizing plate.

17. A manufacturing method of a semiconductor device comprising a substrate and a semiconductor layer having a channel region, wherein:
the channel region is formed with an oxide semiconductor which satisfies Vc/Va>4 where Vc is a volume ratio of a crystalline component and Va is a volume ratio of a non-crystalline component.

18. The manufacturing method of a semiconductor device according to claim 17, wherein the oxide semiconductor comprises In and Zn.

19. The manufacturing method of a semiconductor device according to claim 18, wherein the oxide semiconductor further comprises at least one of Ga and Al.

20. The manufacturing method of a semiconductor device according to claim 17, wherein the semiconductor layer has a thickness of smaller than 300 nm.

21. The manufacturing method of a semiconductor device according to claim 17, wherein the semiconductor device is produced by forming a film by a precursor solution or a fine particle dispersion liquid for the semiconductor layer and annealing the film by heat or light.

22. The manufacturing method of a semiconductor device according to claim 17, wherein the semiconductor device is produced by forming a film that satisfies Vc/Va<0.25 and annealing the film by heat or light.

23. The manufacturing method of a semiconductor device according to claim 17, wherein mobility of the semiconductor layer is higher than or equal to 0.5 $cm^2/V \cdot s$.

24. The manufacturing method of a semiconductor device according to claim 17, wherein mobility of the semiconductor layer is higher than or equal to 10 $cm^2/V \cdot s$.

25. A manufacturing method of a display device comprising the semiconductor device manufactured by the manufacturing method according to claim 17, wherein:
a transparent gate electrode is formed and part of incident light passes through the channel region and the gate electrode.

26. The manufacturing method of a display device according to claim 25, wherein at least 50% of the incident light passes through the channel region.

27. The manufacturing method of a display device according to claim 25, wherein a light absorption layer for absorbing at least part of light having a wavelength range of nm or less of the incident light is formed on the light incidence side of the channel region.

28. The manufacturing method of a display device according to claim 25, a light absorption layer for absorbing at least part of the light having a wavelength range of 350 nm or less of the incident light is formed on the light incidence side of the channel region.

29. The manufacturing method of a display device according to claim 27, wherein the light absorption layer also serves as at least one of the substrate and a polarizing plate.

* * * * *